(12) United States Patent
Kim et al.

(10) Patent No.: US 10,418,576 B2
(45) Date of Patent: Sep. 17, 2019

(54) LIGHT EMITTING DIODE AND DISPLAY DEVICE INCLUDING THE SAME

(71) Applicant: SAMSUNG DISPLAY CO., LTD., Yongin-si, Gyeonggi-do (KR)

(72) Inventors: Dong Chan Kim, Gunpo-si (KR); Ji Young Moon, Gwangju-si (KR); Yeong Rong Park, Osan-si (KR); Dong Kyu Seo, Suwon-si (KR); Myung Chul Yeo, Asan-si (KR); Ji Hye Lee, Incheon (KR); Hyung Seok Jang, Seoul (KR); Won Jong Kim, Suwon-si (KR); Yoon Hyeung Cho, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/921,745

(22) Filed: Mar. 15, 2018

(65) Prior Publication Data

US 2019/0081266 A1   Mar. 14, 2019

(30) Foreign Application Priority Data

Sep. 12, 2017   (KR) .......................... 10-2017-0116533

(51) Int. Cl.
*H01L 51/50* (2006.01)
*H01L 51/52* (2006.01)
*H01L 51/00* (2006.01)

(52) U.S. Cl.
CPC ........ *H01L 51/5012* (2013.01); *H01L 51/506* (2013.01); *H01L 51/508* (2013.01); *H01L 51/5076* (2013.01); *H01L 51/5206* (2013.01); *H01L 51/5221* (2013.01); *H01L 51/0089* (2013.01); *H01L 51/5092* (2013.01);
(Continued)

(58) Field of Classification Search
CPC .............. H01L 51/5012; H01L 51/506; H01L 51/5206; H01L 51/5221; H01L 51/5076; H01L 51/508; H01L 51/5096; H01L 2251/5315; H01L 51/0089;
(Continued)

(56) References Cited

U.S. PATENT DOCUMENTS 5,677,572 A    10/1997 Hung et al.
2004/0126619 A1*  7/2004 Nishita ............... H01L 51/0052
                                                    428/690
(Continued)

FOREIGN PATENT DOCUMENTS

JP          3327558 B2     9/2002
KR       10-0853087 B1     8/2008
WO       WO 97/20355 A1    6/1997

OTHER PUBLICATIONS

Salem, Studies on the Opto-Electronic Constants of Alkali-Halide Crystals, Turk J. Phys 27, 569-577 (2003).
(Continued)

*Primary Examiner* — Karen Kusumakar
(74) *Attorney, Agent, or Firm* — Lee & Morse, P.C.

(57) ABSTRACT

A light emitting diode including a first electrode; a second electrode overlapping the first electrode; an emission layer positioned between the first electrode and the second electrode; and an electron transporting region positioned between the second electrode and the emission layer, wherein the electron transporting region includes a tellurium compound of a rare earth metal.

13 Claims, 2 Drawing Sheets

(52) U.S. Cl.
CPC .. *H01L 51/5096* (2013.01); *H01L 2251/5315* (2013.01); *H01L 2251/5353* (2013.01); *H01L 2251/558* (2013.01)

(58) Field of Classification Search
CPC ....... H01L 2251/5353; H01L 2251/558; H01L 51/5092
See application file for complete search history.

(56) References Cited

U.S. PATENT DOCUMENTS

| | | | |
|---|---|---|---|
| 2013/0341612 A1* | 12/2013 | Oohisa | C07D 209/86 257/40 |
| 2017/0059891 A1* | 3/2017 | Giessen | G02F 1/0136 |
| 2017/0186909 A1 | 6/2017 | Kim et al. | |
| 2018/0233689 A1* | 8/2018 | Kim | H01L 51/5088 |

OTHER PUBLICATIONS

Wu, et al., Energy structures and chemical reactions at the Al / Li F / Al q 3 interfaces studied by synchrotron-radiation photoemission spectroscopy, APL 87, 212108 (2005).

Verma, Electronic and Optical Properties of Rare-earth Chalcogenides and Pnictides, African Physical Review (2009) 3: 0003, pp. 11-20.

Yadav, Electronic and mechanical properties of rare earth monochalcogenides, Journal of Alloys and Compounds 537 (2012) 250-254.

Kaya, et al., Maximum hardness and minimum polarizability principles through lattice energies of ionic compounds, Physica B 485 (2016) 60-66.

* cited by examiner

LIGHT EMITTING DIODE AND DISPLAY DEVICE INCLUDING THE SAME

CROSS-REFERENCE TO RELATED APPLICATION

Korean Patent Application No. 10-2017-0116533 filed on Sep. 12, 2017, in the Korean Intellectual Property Office, and entitled: "Light Emitting Diode and Display Device Including the Same," is incorporated by reference herein in its entirety.

BACKGROUND

1. Field

Embodiments relate to a light emitting diode and a display device including the same.

2. Description of the Related Art

An organic light emitting diode display device, which is a self-emissive type of display device, has advantages of a wide viewing angle, high contrast, and a fast response time.

The organic light emitting diode display device includes organic light emitting diodes for light emitting, and in the organic light emitting diodes, electrons injected from one electrode and holes injected from another electrode are combined with each other in a light emitting layer thereby generating excitons, and energy is outputted from the excitons to emit light.

The above information disclosed in this Background section is only for enhancement of understanding of the background of the invention and therefore it may contain information that does not form the prior art that is already known in this country to a person of ordinary skill in the art.

SUMMARY

Embodiments are directed to a light emitting diode and a display device including the same.

The embodiments may be realized by providing a light emitting diode including a first electrode; a second electrode overlapping the first electrode; an emission layer positioned between the first electrode and the second electrode; and an electron transporting region positioned between the second electrode and the emission layer, wherein the electron transporting region includes a tellurium compound of a rare earth metal.

The rare earth metal may be a lanthanide metal.

The tellurium compound of the rare earth metal may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, or $Lu_2Te_3$.

The tellurium compound of the rare earth metal may be included in the electron transporting region in an amount of 1 vol % to 10 vol %.

The second electrode may include an alloy made of two or more of Ag, Mg, Al, and Yb.

A permittivity of the tellurium compound of the rare earth metal may be in a range of 5 to 12.

An electronic polarizability of the tellurium compound of the rare earth metal may be in a range of 8 to 15.

The embodiments may be realized by providing a light emitting diode including a first electrode; a second electrode overlapping the first electrode, the second electrode including at least one of AgMg and AgYb; an emission layer positioned between the first electrode and the second electrode; and an electron transporting region positioned between the second electrode and the emission layer, wherein the electron transporting region includes a tellurium compound of a rare earth metal.

The rare earth metal may be a lanthanide metal.

The tellurium compound of the rare earth metal may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, or $Lu_2Te_3$.

The tellurium compound of the rare earth metal may be included in the electron transporting region in an amount of 1 vol % to 10 vol %.

A permittivity of the tellurium compound of the rare earth metal may be 5 to 12.

An electronic polarizability of the tellurium compound of the rare earth metal may be in a range of 8 to 15.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. In addition, it will also be understood that when a layer is referred to as being "between" two layers, it can be the only layer between the two layers, or one or more intervening layers may also be present. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "includes," "including," "comprises," or "comprising" will be understood to imply the inclusion of stated elements but not the exclusion of any other elements. As used herein, the term "or" is not an exclusive term, e.g., the term "or" has the same meaning as the term "and/or."

Throughout the specification, the phrase "on a plane" means viewing the object portion from the top, and the phrase "on a cross-section" means viewing a cross-section of which the object portion is vertically cut from the side.

Figure 1:
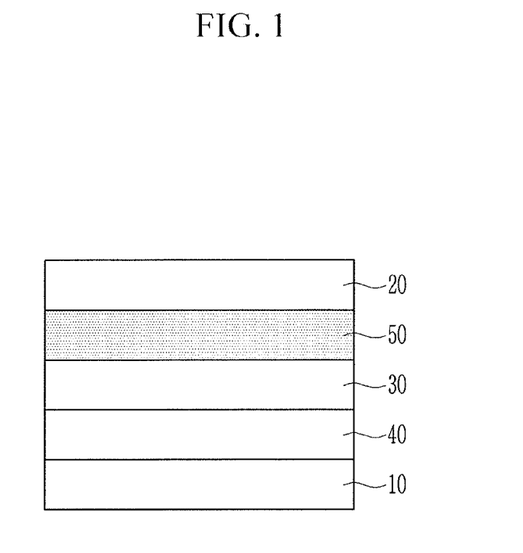
FIG. 1 illustrates a cross-sectional view of a light emitting diode according to an exemplary embodiment.

Hereinafter, a light emitting diode according to an exemplary embodiment will be described with reference to FIG. 1. FIG. 1 illustrates a cross-sectional view of a light emitting diode according to an exemplary embodiment.

Referring to FIG. 1, a light emitting diode according to an exemplary embodiment may include a first electrode 10, a second electrode 20 overlapping the first electrode 10, and an emission layer 30 positioned between the first electrode 10 and the second electrode 20.

A substrate may be disposed at a lower portion of the first electrode 10 or an upper portion of the second electrode 20. The substrate may be made of a glass or plastic material having excellent mechanical strength, thermal stability, transparency, surface smoothness, ease of handling, and water resistance.

The first electrode 10 may be an anode, and the second electrode 20 may be a cathode. The first electrode 10 corresponding to the anode is an electrode for injecting holes into the emission layer 30 when supplied with a current, and may include a material having a high work function. The second electrode 20 is an electrode for injecting electrons into the emission layer 30 when supplied with a current, and may include a material having a low work function. In an implementation, the first electrode 10 may be a cathode, and the second electrode 20 may be an anode.

Each of the first electrode 10 and the second electrode 20 may include a conductive oxide, e.g., indium tin oxide (ITO), indium zinc oxide (IZO), zinc tin oxide (ZTO), copper indium oxide (CIO), copper zinc oxide (CZO), gallium zinc oxide (GZO), aluminum zinc oxide (AZO), tin oxide ($SnO_2$), zinc oxide (ZnO), or combinations thereof, calcium (Ca), ytterbium (Yb), aluminum (Al), silver (Ag), magnesium (Mg), samarium (Sm), titanium (Ti), gold (Au), or alloys thereof, graphene, carbon nanotubes, or a conductive polymer such as PEDOT:PSS. Each of the first electrode 10 and the second electrode 20 may have a single layered structure or a two or more layered structure.

In an implementation, the first electrode 10 may be a reflective electrode having an ITO/Ag/ITO structure, and the second electrode 20 may be transflective electrode including AgMg or AgYb. Light emitted from the emission layer 30 may be reflected by the first electrode 10 which is the reflective electrode, and may be resonated and amplified between the second electrode 20 which is the transflective electrode and the first electrode 10. The resonated light is reflected by the first electrode 10 and is emitted from the second electrode 20.

In an implementation, the second electrode 20 may include an alloy made of two or more of silver (Ag), magnesium (Mg), aluminum (Al), and ytterbium (Yb). The second electrode 20 may include AgMg or AgYb, and a content of the Ag of the second electrode 20 may be more than that of Mg or Yb thereof. The content of Mg or Yb may be about 10 vol %.

In an implementation, the first electrode 10 and the second electrode 20 may be formed by, e.g., a sputtering method, a vapor phase deposition method, an ion beam deposition method, an electron beam deposition method, or the like.

The emission layer 30 may be positioned between the first electrode 10 and the second electrode 20. In an implementation, a hole transporting region 40 may be positioned between the first electrode 10 and the emission layer 30, and an electron transporting region 50 may be positioned between the second electrode 20 and the emission layer 30.

The hole transporting region 40 may have i) a single-layered structure with a single layer made of a single material, ii) a single-layered structure with a single layer made of a plurality of different materials, or iii) a multi-layered structure with a plurality of layers made of a plurality of different materials.

The hole transporting region 40 may include at least one of a hole injection layer HIL, a hole transporting layer HTL, an emissive auxiliary layer, and an electron blocking layer EBL. In an implementation, the hole transporting region 40 may have a single-layered structure with a single layer made of a plurality of different materials, or a multi-layered structure with a hole injection layer/a hole transporting layer, a hole injection layer/a hole transporting layer/an emissive auxiliary layer, a hole injection layer/an emissive auxiliary layer, a hole transporting layer/an emissive auxiliary layer that are sequentially stacked from the first electrode 10, or a hole injection layer/a hole transporting layer/an electron blocking layer.

In an implementation, the hole transporting region 40 may include at least one of m-MTDATA, TDATA, 2-TNATA, NPB(NPD), β-NPB, TPD, Spiro-TPD, Spiro-NPB, methylated-NPB, TAPC, HMTPD, TCTA (4,4',4"-tris(N-carbazolyl)triphenylamine, PANI/DBSA (polyaniline/dodecylbenzenesulfonic acid, PEDOT/PSS (poly(3,4-ethylenedioxythiophene)/poly(4-styrenesulfonate), PANI/CSA (polyaniline/camphor sulfonic acid), PANI/PSS (polyaniline/poly(4-styrenesulfonate), a compound represented by the following Chemical Formula 201, and a compound represented by the following Chemical Formula 202.

m-MTDATA

TDATA

2-TNATA

NPB

β-NPB

TPD

Spiro-TPD

Spiro-NPB methylated NPB

-continued

TAPC

HMTPD

<Chemical Formula 201>

<Chemical Formula 202>

In Chemical Formulas 201 and 202, each of $L_{201}$ to $L_{204}$ may be independently selected from a substituted or unsubstituted C3-C10 cycloalkylene group, a substituted or unsubstituted C1-C10 heterocycloalkylene group, a substituted or unsubstituted C3-C10 cycloalkenylene group, a substituted or unsubstituted C1-C10 heterocycloalkenylene group, a substituted or unsubstituted C6-C60 arylene group, a substituted or unsubstituted C1-C60 heteroarylene group, a substituted or unsubstituted divalent non-aromatic condensed polycyclic group, and a substituted or unsubstituted divalent non-aromatic hetero-condensed polycyclic group; $L_{205}$ may be selected from .—O—.', .—S—.', .—N $Q_{201}$-*', a substituted or unsubstituted C1-C20 alkylene group, a substituted or unsubstituted C2-C20 alkenylene group, a substituted or unsubstituted C3-C10 cycloalkylene group, a substituted or unsubstituted C1-C10 heterocycloalkylene group, a substituted or unsubstituted C3-C10 cycloalkenylene, a substituted or unsubstituted C1-C10 heterocycloalkenylene, a substituted or unsubstituted C6-C60 arylene group, a substituted or unsubstituted C1-C60 a heteroarylene group, a substituted or unsubstituted divalent non-aromatic condensed polycyclic group, and a substituted or unsubstituted divalent non-aromatic hetero-condensed polycyclic group; each of xa1 to xa4 may be independently selected from 0 to 3 which are integers; xa5 may be selected from 1 to 10 which are integers; and each of $R_{201}$ to $R_{204}$ and $Q_{201}$ may be independently selected from a substituted or unsubstituted C3-C10 cycloalkyl, a substituted or unsubstituted C1-C10 heterocycloalkyl group, a substituted or unsubstituted C3-C10 cycloalkenyl group, a substituted or unsubstituted C1-C10 heterocycloalkenyl group, a substituted or unsubstituted C6-C60 aryl group, a substituted or unsubstituted C6-C60 aryloxy group, a substituted or unsubstituted C6-C60 arylthio group, a substituted or unsubstituted C1-C60 heteroaryl group, a substituted or unsubstituted monovalent non-aromatic condensed polycyclic group, and a substituted or unsubstituted monovalent non-aromatic hetero-condensed polycyclic group.

The hole transporting region 40 may further include a charge-generating material for conductivity enhancement in addition to the above-mentioned material. The charge-generating material may be uniformly or non-uniformly dispersed in the hole transporting region 40. The charge-generating material may be, for example, a p-dopant.

When an organic light emitting diode is a full color organic light emitting diode, the emission layer 30 may be patterned into a red emission layer, a green emission layer, and a blue emission layer for each subpixel. Alternatively, the emission layer 30 may have a structure in which two or more selected from a red emission layer, a green emission layer, and a blue emission layer are contacted with or spaced from each other to be stacked, or may have a structure in which two or more materials selected from a red light emitting material, a green light emitting material, and a blue light emitting material are mixed without layering, thereby emitting white light.

The emission layer 30 may include a host and a dopant. The dopant may include at least one of a phosphorescent dopant and a fluorescent dopant. In an implementation, a content of the dopant in the emission layer 30 may be selected from, e.g., a range of about 0.01 to about 15 parts by weight based on 100 parts by weight of the host.

A material of a host of the emission layer may include tris(8-hydroxy-quinolinato)aluminum (Alq3), 9,10-di (naphth-2-yl)anthracene (ADN), 3-tert-butyl-9,10-di (naphth-2-yl)anthracene (TBADN), 4,4'-bis(2,2-diphenyl-ethene-1-yl)-4,4'-dimethylphenyl (DPVBi), 4,4'-bisbis(2,2-diphenyl-ethene-1-yl)-4,4'-methylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), or the like, and a phosphorescent host may have a material including 1,3-bis (carbazole-9-yl)benzene (mCP), 1,3,5-tris(carbazole-9-yl) benzene (tCP), 4,4',4"-tris(carbazole-9-yl)triphenylamine (TcTa), 4,4'-bis(carbazole-9-yl)biphenyl (CBP), 4,4'-bis(9-carbazolyl)-2,2'-dimethyl-biphenyl (CBDP), 4,4'-bis(carbazole-9-yl)-9,9-dimethyl-fluorene (DMFL-CBP), 4,4'-bis (carbazole-9-yl)-9,9-bis(9-phenyl-9H-carbazole)fluorene (FL-4CBP), 4,4'-bis(carbazole-9-yl)-9,9-di-tolyl-fluorene (DPFL-CBP), 9,9-bis(9-phenyl-9H-carbazole)fluorene (FL-2CBP), or the like.

In an implementation, the dopant may include, e.g., 8-hydroxyquinoline and complexes of similar derivatives, benzazole derivatives, or the like.

A thickness of the emission layer 30 may be about 100 Å to about 1,000 Å, e.g., may be about 200 Å to about 600 Å. When the thickness of the emission layer 30 satisfies the above-mentioned range, it is possible to provide excellent luminescence characteristics without substantially increasing a driving voltage.

The electron transporting region 50 may be positioned between the emission layer 30 and the second electrode 20.

The electron transporting region 50 may include, e.g., a tellurium compound of a rare earth metal. In an implementation, the rare earth metal may be, e.g., a lanthanide metal. In an implementation, the tellurium compound of the rare earth metal may include, e.g., LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, or $Lu_2Te_3$.

In an implementation, the permittivity of the tellurium compound of the rare earth metal may be, e.g., in a range of 5 to 12. In an implementation, the electronic polarizability of the tellurium compound of the rare earth metal may be, e.g., in a range of 8 to 15. For example, the permittivity of SmTe may be 7.2, the permittivity of EuTe may be 7.23, and the permittivity of YbTe may be 6.58. In addition, the electronic polarizability of SmTe may be 11.49, the electronic polarizability of EuTe may be 11.46, and the electronic polarizability of YbTe may be 10.09.

In an implementation, in the electron transporting region, the tellurium compound of the rare earth metal may be included in an amount of 1 vol % to 10 vol %.

The tellurium compound of the rare earth metal having such physical properties, while having relatively high dissociation energy, may be robust against oxidation due to atmospheric exposure. The electron transporting region 50 according to the exemplary embodiment may include the tellurium compound of the rare earth metal, and it is possible to provide an electron transporting region with excellent electron injection efficiency.

In an implementation, the electron transporting region 50 according to an exemplary embodiment may have i) a single-layered structure with a single layer made of a single material, ii) a single-layered structure with a single layer made of a plurality of different materials, or iii) a multi-layered structure with a plurality of layers made of a plurality of different materials.

In an implementation, the electron transporting region 50 may include, e.g., at least one of a buffer layer, a hole blocking layer, an electron adjusting layer, an electron transporting layer ETL, and an electron injection layer. In an implementation, the electron transporting region 50 may have, e.g., a structure formed with an electron transporting layer/an electron injection layer, a hole blocking layer/an electron transporting layer/an electron injection layer, and an electron adjusting layer/an electron transporting layer/an electron injection layer that are sequentially stacked from the first electrode 10, or a structure formed with a buffer layer/an electron transporting layer/an electron injection layer.

In an implementation, a thickness of the electron transporting region 50 may be about 10 Å to about 1,000 Å, e.g., may be about 10 Å to about 500 Å. When the thickness of the electron transporting region 50 satisfies the above-mentioned range, it is possible to provide satisfactory electron transporting characteristics without substantially increasing a driving voltage.

In an implementation, a first capping layer positioned at a back surface of the first electrode 10, or a second capping layer positioned on the second electrode 20, may be further included. The first capping layer or the second capping layer may help improve external luminous efficiency by the principle of constructive interference.

Each of the first capping layer and the second capping layer may independently be an organic capping layer made of an organic material, an inorganic capping layer made of an inorganic material, or a composite capping layer containing organic and inorganic materials.

At least one of the first capping layer and the second capping layer may independently include at least one of a carbocyclic compound, a heterocyclic compound, an amine compound, porphyrin derivatives, phthalocyanine derivatives, naphthalocyanine derivatives, an alkali metal complex, and an alkaline earth metal complex. The carbocyclic compound, the heterocyclic compound, and the amine compound may be selectively substituted with a substituent including at least one of O, N, S, Se, Si, F, Cl, Br, and I. According to the exemplary embodiment, at least one of the first capping layer and the second capping layer may independently include the amine compound.

The layers included in the hole transporting region 40, the emission layer 30, and the layers included in the electron transporting region 50 may be respectively formed by various methods such as a vacuum deposition method, a spin coating method, a casting method, a Langmuir-Blodgett method, an inkjet printing method, a laser printing method, a laser induced thermal imaging (LITI) method, and the like.

When the layers included in the hole transporting region 40, the emission layer 30 and the layers included in the electron transporting region 50 are respectively formed by the vacuum deposition method, a deposition conditions may be selected within a range of, e.g., a deposition temperature of about 100 to about 500° C., a vacuum degree of about $10^{-8}$ to about $10^{-3}$ torr, and a deposition rate of about 0.01 to about 100 Å/s in consideration of a compound to be contained in the layer to be formed and a structure of the layer to be formed.

Figure 2:
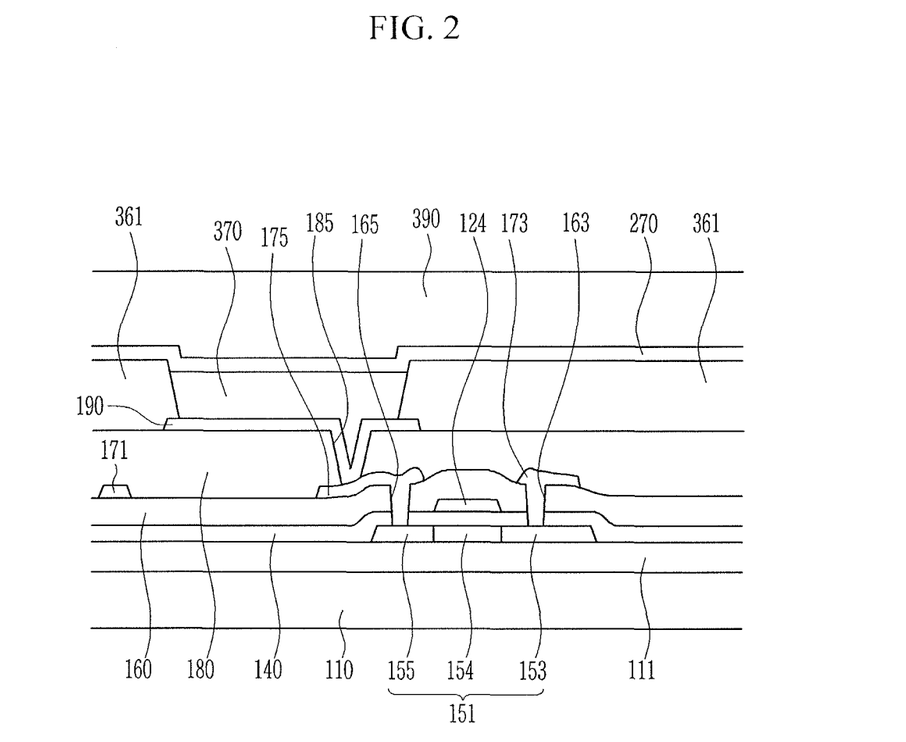
FIG. 2 illustrates cross-sectional view of a display device according to an exemplary embodiment.

Hereinafter, a display device according to an exemplary embodiment will be described with reference to FIG. 2. FIG. 2 illustrates cross-sectional view of a display device according to an exemplary embodiment.

Referring to FIG. 2, a blocking layer 111 made of a silicon oxide or a silicon nitride may be positioned on a substrate 110.

A semiconductor layer 151 may be positioned on the blocking layer 111. The semiconductor layer 151 includes a source region 153 and a drain region 155 doped with p-type impurities, and includes a channel region 154 positioned between the source region 153 and the drain region 155.

A gate insulating layer 140 may be positioned on the semiconductor layer 151 and the blocking layer 111, and may include a silicon oxide or a silicon nitride. A control electrode 124 overlaps the channel region 154 of the semiconductor layer 151, and is positioned on the gate insulating layer 140.

An interlayer insulating layer 160 may be positioned on the control electrode 124 and the gate insulating layer 140. The interlayer insulating layer 160 may be provided with a first contact hole 165 and a second contact hole 163.

A data conductor including a data line 171, an input electrode 173, and an output electrode 175 may be positioned on the interlayer insulating layer 160.

The output electrode 175 may be connected to the drain region 155 through the first contact hole 165. In addition, the input electrode 173 may be connected to the source region 153 through the second contact hole 163.

A passivation layer 180 may be positioned on the data conductor (171, 173, and 175) and the interlayer insulating layer 160, and the passivation layer 180 may be provided with a contact hole 185.

A pixel electrode 190 may be positioned on the passivation layer 180. The pixel electrode 190 may be connected to the output electrode 175 through the contact hole 185. A partition wall 361 may be positioned on the passivation layer 180. A light emitting diode layer 370 may be positioned to overlap the pixel electrode 190, and a common electrode 270 may be positioned to overlap the light emitting diode layer 370. The light emitting diode includes the pixel electrode 190, the light emitting diode layer 370, and the common electrode 270.

In an implementation, the pixel electrode 190 may be an anode (which is a hole injection electrode) and may correspond to the first electrode 10 described with reference to FIG. 1, and the common electrode 270 may be a cathode (which is an electron injection electrode) and may correspond to the second electrode 20 described with reference to FIG. 1. In an implementation, and the pixel electrode 190 may be a cathode and the common electrode 270 may be an anode depending on a driving method of the display device.

The light emitting diode layer 370 may include the emission layer 30, the hole transporting region 40, and the electron transporting region 50 described with reference to FIG. 1. Thus, a specific description thereof will be omitted.

An encapsulation layer 390 may be positioned to overlap the common electrode 270. The encapsulation layer 390 may contain an organic material or an inorganic material, or the organic material and the inorganic material organic material may be alternately stacked therein. The encapsulation layer 390 may protect the display device from external moisture, heat, and other pollutants.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Hereinafter, driving voltages and current efficiency according to an Example and Comparative Examples will be described with reference to Table 1.

Example 1 is a diode of which an electron transporting region included YbTe and of which a thickness is 13 Å, and Comparative Example 1 is a diode of which an electron transporting region included Yb and of which a thickness is 13 Å. Comparative Example 2 is a diode of which an electron transporting region included KI and of which a thickness is 13 Å. Example 1, Comparative Example 1, and Comparative Example 2 included a cathode made of AgMg.

The driving voltages and the current efficiency were measured before and after exposure to the atmosphere for each of Example 1, Comparative Example 1, and Comparative Example 2.

TABLE 1

|  | Before atmospheric exposure | | After atmospheric exposure | |
| --- | --- | --- | --- | --- |
|  | Driving voltage (V) | Current efficiency (Cd/A) | Driving voltage (V) | Current efficiency (Cd/A) |
| Example 1 | 4.0 | 120 | 4.2 | 115 |
| Comparative Example 1 | 4.7 | 79 | 14.8 | 23.7 |
| Comparative Example 2 | 4.9 | 98 | 10.5 | 58 |

According to Table 1, before the exposure to the atmosphere, the driving voltage and current efficiency of Example 1 were respectively about 4.0 V and 120 Cd/A. After the exposure to the atmosphere, the driving voltage and current efficiency of Example 1 were respectively about 4.2 V and 115 Cd/A. In Example 1, the driving voltage and the current efficiency were finely varied according to the exposure to the atmosphere, and the variation ratio was about 5%.

In contrast, before the exposure to the atmosphere, the driving voltage and current efficiency of Comparative Example 1 were respectively about 4.7 V and 79 Cd/A. After the exposure to the atmosphere, the driving voltage and current efficiency of Comparative Example 1 were respectively about 14.8 V and 23.7 Cd/A. In Comparative Example 1, it may be seen that the driving voltage thereof was increased by about three times and the current efficiency thereof was reduced by about one third, depending on the exposure to the atmosphere.

Further, before the exposure to the atmosphere, the driving voltage and current efficiency of Comparative Example 2 were respectively about 4.9 V and 98 Cd/A. After the exposure to the atmosphere, the driving voltage and current efficiency of Comparative Example 2 were respectively about 10.5 V and 58 Cd/A. In Comparative Example 2, it may be seen that the driving voltage thereof was increased by about three times according to the exposure to the atmosphere, and the current efficiency thereof was reduced to about 60% compared to before the exposure to the atmosphere.

As described above, according to the exemplary embodiment, even when the electron transporting region including the tellurium compound of the rare earth metal is exposed to the atmosphere during the manufacturing process, deterioration of physical properties thereof due to oxidation or the like may be reduced and/or prevented. Therefore, it is possible to provide a light emitting device having improved reliability and stable physical properties and a display device including the same.

The structure of the described display device is one example, and the light emitting diode according to the exemplary embodiment of the present disclosure may be clearly applied to a display device having a different structure.

The embodiments may provide a light emitting diode of which light emitting efficiency is improved.

According to the light emitting diode of the embodiment, it is possible to improve light emitting efficiency.

DESCRIPTION OF SYMBOLS

10: first electrode
20: second electrode
30: emission layer
40: hole transport layer
50: electron transport layer Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light emitting diode, comprising:
a first electrode;
a second electrode overlapping the first electrode;
an emission layer positioned between the first electrode and the second electrode; and
an electron transporting region positioned between the second electrode and the emission layer,
wherein the electron transporting region includes a tellurium compound of a rare earth metal.

2. The light emitting diode as claimed in claim 1, wherein the rare earth metal is a lanthanide metal.

3. The light emitting diode as claimed in claim 1, wherein the tellurium compound of the rare earth metal includes LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, or $Lu_2Te_3$.

4. The light emitting diode as claimed in claim 1, wherein the tellurium compound of the rare earth metal is included in the electron transporting region in an amount of 1 vol % to 10 vol %.

5. The light emitting diode as claimed in claim 1, wherein the second electrode includes an alloy made of two or more of Ag, Mg, Al, and Yb.

6. The light emitting diode as claimed in claim 1, wherein a permittivity of the tellurium compound of the rare earth metal is in a range of 5 to 12.

7. The light emitting diode as claimed in claim 1, wherein an electronic polarizability of the tellurium compound of the rare earth metal is in a range of 8 to 15.

8. A light emitting diode, comprising:
a first electrode;
a second electrode overlapping the first electrode, the second electrode including at least one of AgMg and AgYb;
an emission layer positioned between the first electrode and the second electrode; and
an electron transporting region positioned between the second electrode and the emission layer,
wherein the electron transporting region includes a tellurium compound of a rare earth metal.

9. The light emitting diode as claimed in claim 8, wherein the rare earth metal is a lanthanide metal.

10. The light emitting diode as claimed in claim 8, wherein the tellurium compound of the rare earth metal includes LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, or $Lu_2Te_3$.

11. The light emitting diode as claimed in claim 8, wherein the tellurium compound of the rare earth metal is included in the electron transporting region in an amount of 1 vol % to 10 vol %.

12. The light emitting diode as claimed in claim 8, wherein a permittivity of the tellurium compound of the rare earth metal is 5 to 12.

13. The light emitting diode as claimed in claim 8, wherein an electronic polarizability of the tellurium compound of the rare earth metal is in a range of 8 to 15.

* * * * *